United States Patent
Thomsen et al.

(10) Patent No.: US 10,175,271 B2
(45) Date of Patent: Jan. 8, 2019

(54) APPARATUS FOR DIFFERENCING COMPARATOR AND ASSOCIATED METHODS

(71) Applicant: Silicon Laboratories Inc., Austin, TX (US)

(72) Inventors: Axel Thomsen, Austin, TX (US); Kenneth W. Fernald, Austin, TX (US); Pavel Konecny, San Jose, CA (US)

(73) Assignee: Silicon Laboratories Inc., Austin, TX (US)

( * ) Notice: Subject to any disclaimer, the term of this patent is extended or adjusted under 35 U.S.C. 154(b) by 263 days.

(21) Appl. No.: 14/306,112

(22) Filed: Jun. 16, 2014

(65) Prior Publication Data

US 2014/0312820 A1 Oct. 23, 2014

Related U.S. Application Data

(63) Continuation-in-part of application No. 13/740,028, filed on Jan. 11, 2013, now Pat. No. 9,048,777.

(Continued)

(51) Int. Cl.
*G05F 1/00* (2006.01)
*G01R 17/02* (2006.01)
(Continued)

(52) U.S. Cl.
CPC ............ *G01R 17/02* (2013.01); *H02P 6/28* (2016.02); *H02P 27/06* (2013.01);
(Continued)

(58) Field of Classification Search
CPC .. H02P 27/06; H02P 31/00; H02P 2007/0088; H02P 6/002; H02P 6/187; H02P 7/29; H02P 7/292; H02P 1/00; H02P 6/00; H02P 23/00; H02P 27/00; G05F 1/00; G05B 2219/33229; H03F 3/45; H03F 3/005; H03F 3/602
USPC ........... 318/139, 439, 400.06, 400.2, 400.12, 318/400.3, 400.01, 400.14, 700, 701, 727, 318/400.21, 430, 678, 679, 680; 327/52, 327/89, 96; 330/252
See application file for complete search history.

(56) References Cited

U.S. PATENT DOCUMENTS 4,806,791 A 2/1989 Mizuide .................. 307/355
5,374,859 A * 12/1994 Doyle ................ H03K 5/2481
327/63

(Continued)

OTHER PUBLICATIONS

National Semiconductor Application Note 31, *Op Amp Circuit Collection*, 2002, 33 pgs.

(Continued)

*Primary Examiner* — Antony M Paul
(74) *Attorney, Agent, or Firm* — Law Offices of Maximilian R. Peterson

(57) ABSTRACT

An apparatus includes an integrated circuit (IC). The IC includes a differencing comparator. The differencing comparator receives a differential input signal. The differencing comparator compares the differential input signal to a threshold value. The differencing comparator includes a transconductance circuit coupled to receive the differential input signal and to provide a differential output signal.

20 Claims, 6 Drawing Sheets

Related U.S. Application Data

(60) Provisional application No. 61/747,533, filed on Dec. 31, 2012.

(51) Int. Cl.
  *H02P 27/06* (2006.01)
  *H03F 3/45* (2006.01)
  *H02P 6/28* (2016.01)
  *H02M 1/00* (2006.01)
  *H02P 6/18* (2016.01)
  *H02P 31/00* (2006.01)

(52) U.S. Cl.
  CPC . *H03F 3/45206* (2013.01); *H02M 2001/0009* (2013.01); *H02M 2001/0025* (2013.01); *H02P 6/187* (2013.01); *H02P 31/00* (2013.01)

(56) References Cited

U.S. PATENT DOCUMENTS

| | | | | |
|---|---|---|---|---|
| 5,404,053 A * | 4/1995 | Poma | H03F 1/523 | 327/108 |
| 5,488,321 A * | 1/1996 | Johnson | H03F 3/345 | 327/312 |
| 5,663,713 A * | 9/1997 | Ironside | B62D 5/0493 | 327/143 |
| 5,729,230 A * | 3/1998 | Jensen | H03M 3/396 | 341/118 |
| 5,744,385 A * | 4/1998 | Hojabri | H01L 27/0802 | 257/E27.047 |
| 5,880,634 A * | 3/1999 | Babanezhad | H03F 3/45475 | 327/557 |
| 5,999,052 A * | 12/1999 | Tang | H03F 3/45188 | 330/253 |
| 6,100,672 A * | 8/2000 | Siponen | H02J 7/0077 | 320/150 |
| 6,166,971 A * | 12/2000 | Tamura | G11C 7/1012 | 365/191 |
| 6,194,958 B1 * | 2/2001 | Goldfarb | H03H 11/0472 | 327/552 |
| 6,204,980 B1 * | 3/2001 | Momtaz | G11B 5/59622 | 330/252 |
| 6,239,595 B1 * | 5/2001 | Shinjo | G01R 33/09 | 324/207.21 |
| 6,262,624 B1 * | 7/2001 | Tsinker | H03J 7/04 | 327/552 |
| 6,266,591 B1 * | 7/2001 | Wilson-Jones | B62D 5/0481 | 180/421 |
| 6,323,692 B1 * | 11/2001 | Tsinker | H03D 13/004 | 327/12 |
| 6,335,893 B1 * | 1/2002 | Tanaka | G11C 5/145 | 257/E27.097 |
| 6,356,160 B1 * | 3/2002 | Robinson | H03L 7/085 | 327/111 |
| 6,400,616 B1 * | 6/2002 | Tamura | G11C 7/1012 | 365/198 |
| 6,496,052 B1 * | 12/2002 | Chiu | H03K 17/0822 | 327/512 |
| 6,512,400 B1 * | 1/2003 | Forbes | H03F 3/45183 | 327/563 |
| 6,515,903 B1 * | 2/2003 | Le | G11C 16/30 | 327/536 |
| 6,526,113 B1 * | 2/2003 | Gutierrez | H03L 7/089 | 327/156 |
| 6,535,435 B2 * | 3/2003 | Tanaka | G11C 5/145 | 257/E27.097 |
| 6,650,720 B1 * | 11/2003 | Grung | H03L 7/085 | 375/375 |
| 6,667,843 B2 * | 12/2003 | Norman | G11B 5/5521 | 318/560 |
| 6,701,340 B1 * | 3/2004 | Gorecki | G06J 1/00 | 708/671 |
| 6,710,618 B1 * | 3/2004 | Murray | H03H 11/30 | 326/30 |
| 6,748,041 B1 * | 6/2004 | Gutierrez | H03L 7/089 | 327/156 |
| 6,778,117 B1 * | 8/2004 | Johnson | H03C 3/403 | 341/118 |
| 6,784,698 B1 * | 8/2004 | Brenden | H03F 3/3062 | 327/51 |
| 6,826,734 B1 * | 11/2004 | Murray | H01L 22/20 | 257/E21.525 |
| 6,970,021 B2 * | 11/2005 | Forbes | H03F 3/45183 | 327/563 |
| 7,006,824 B1 * | 2/2006 | Tse | H04B 1/40 | 375/219 |
| 7,075,373 B2 * | 7/2006 | Briskin | H03F 1/523 | 330/207 P |
| 7,126,419 B2 * | 10/2006 | Miyasita | H03F 3/45085 | 330/69 |
| 7,203,474 B2 * | 4/2007 | Shimada | H04B 1/12 | 333/167 |
| 7,236,016 B2 * | 6/2007 | Forbes | H03F 3/45183 | 327/66 |
| 7,250,886 B1 * | 7/2007 | Killat | H03K 17/0416 | 341/143 |
| 7,253,613 B2 * | 8/2007 | Tokuhara | G01D 3/022 | 324/207.25 |
| 7,307,417 B2 * | 12/2007 | Tokuhara | G01D 3/022 | 324/207.2 |
| 7,346,638 B2 * | 3/2008 | Lin | H04L 27/01 | 708/300 |
| 7,358,819 B2 * | 4/2008 | Rollins | H03F 1/34 | 330/308 |
| 7,425,995 B2 * | 9/2008 | Johnson | H03C 3/403 | 348/725 |
| 7,443,214 B2 * | 10/2008 | Kimura | H03H 11/1291 | 327/147 |
| 7,446,573 B1 | 11/2008 | Miller | | 327/57 |
| 7,447,493 B2 * | 11/2008 | Johnson | H03D 7/166 | 348/725 |
| 7,522,368 B2 * | 4/2009 | Xia | G11B 5/5526 | 318/568.22 |
| 7,545,183 B2 * | 6/2009 | Forbes | H03F 3/45183 | 327/108 |
| 7,548,742 B2 * | 6/2009 | Johnson | H03C 3/403 | 341/126 |
| 7,554,408 B2 * | 6/2009 | Chen | H02M 3/07 | 330/297 |
| 7,558,546 B2 * | 7/2009 | Johnson | H03D 7/166 | 455/182.3 |
| 7,599,270 B2 * | 10/2009 | Jin | G11B 7/005 | 369/275.4 |
| 7,663,442 B2 * | 2/2010 | Wu | H03F 3/45183 | 324/225 |
| 7,675,996 B2 * | 3/2010 | Johnson | H03D 7/00 | 375/316 |
| 7,696,650 B2 * | 4/2010 | Ishikawa | H03K 17/567 | 307/113 |
| 7,773,968 B2 * | 8/2010 | Maxim | H04B 1/001 | 341/126 |
| 7,782,141 B2 * | 8/2010 | Witmer | H03F 1/0244 | 330/127 |
| 7,817,998 B1 * | 10/2010 | Tse | H04B 1/40 | 455/423 |
| 7,825,700 B2 * | 11/2010 | Forbes | H03F 3/45183 | 327/65 |
| 7,848,045 B1 * | 12/2010 | Li | G06F 1/32 | 318/599 |
| 7,863,968 B1 * | 1/2011 | Perisetty | G05F 1/56 | 327/537 |
| 7,932,785 B2 * | 4/2011 | Drapkin | H03L 7/0891 | 331/16 |
| 7,936,298 B2 * | 5/2011 | Shabra | H03M 1/0604 | 341/118 |
| 7,983,625 B2 * | 7/2011 | Granata | H03H 7/12 | 327/427 |

(56) References Cited

U.S. PATENT DOCUMENTS

| | | | | |
|---|---|---|---|---|
| 8,107,574 B2* | 1/2012 | Moon | H04L 25/0288 | 327/553 |
| 8,253,473 B2* | 8/2012 | Zuffada | H03H 11/0422 | 327/336 |
| 8,258,816 B2* | 9/2012 | Forbes | H03F 3/45183 | 327/563 |
| 8,373,488 B2* | 2/2013 | Zuffada | H03H 11/0422 | 327/336 |
| 8,373,502 B1* | 2/2013 | Chen | H03H 11/1291 | 327/551 |
| 9,048,777 B2* | 6/2015 | Thomsen | H02P 27/06 | |
| 2002/0041531 A1* | 4/2002 | Tanaka | G11C 5/145 | 365/205 |
| 2002/0101764 A1* | 8/2002 | Tani | G11C 29/846 | 365/185.29 |
| 2002/0149874 A1* | 10/2002 | Norman | G11B 5/5521 | 360/78.04 |
| 2002/0153881 A1* | 10/2002 | Taguchi | G01R 33/09 | 324/207.21 |
| 2003/0071659 A1* | 4/2003 | Forbes | H03F 3/45183 | 327/66 |
| 2003/0078028 A1* | 4/2003 | Shimada | H04B 1/12 | 455/339 |
| 2003/0174023 A1* | 9/2003 | Miyasita | H03F 3/45085 | 330/254 |
| 2004/0169773 A1* | 9/2004 | Johnson | H03D 7/166 | 348/731 |
| 2004/0176058 A1* | 9/2004 | Johnson | H03C 3/403 | 455/147 |
| 2005/0114426 A1* | 5/2005 | Lin | H04L 27/01 | 708/800 |
| 2005/0117071 A1* | 6/2005 | Johnson | H03C 3/403 | 348/729 |
| 2005/0253633 A1* | 11/2005 | Kimura | H03H 11/1291 | 327/156 |
| 2005/0266818 A1* | 12/2005 | Johnson | H03D 7/00 | 455/260 |
| 2006/0038520 A1* | 2/2006 | Negoro | A63C 17/12 | 318/466 |
| 2006/0073800 A1* | 4/2006 | Johnson | H03D 7/166 | 455/182.3 |
| 2006/0091961 A1* | 5/2006 | Briskin | H03F 1/523 | 330/298 |
| 2006/0097717 A1* | 5/2006 | Tokuhara | G01D 3/022 | 324/207.25 |
| 2006/0215787 A1* | 9/2006 | Wu | H03F 3/45183 | 375/316 |
| 2007/0085719 A1* | 4/2007 | Maxim | H03C 3/403 | 341/144 |
| 2007/0164825 A1* | 7/2007 | Rollins | H03F 1/34 | 330/308 |
| 2007/0236825 A1* | 10/2007 | Xia | G11B 5/5526 | 360/78.04 |
| 2007/0247144 A1* | 10/2007 | Tokuhara | G01D 3/022 | 324/207.25 |
| 2007/0252621 A1* | 11/2007 | Forbes | H03F 3/45183 | 327/65 |
| 2007/0279070 A1* | 12/2007 | Moindron | H03K 17/082 | 324/522 |
| 2008/0046182 A1* | 2/2008 | Chao | G01D 3/022 | 702/1 |
| 2008/0046219 A1* | 2/2008 | Chao | G01D 18/008 | 702/189 |
| 2008/0132195 A1* | 6/2008 | Maxim | H04B 1/001 | 455/334 |
| 2008/0157830 A1* | 7/2008 | Kume | H03K 7/08 | 327/110 |
| 2008/0191760 A1* | 8/2008 | Hao | H03L 7/0891 | 327/157 |
| 2008/0290949 A1* | 11/2008 | Chen | H02M 3/07 | 330/297 |
| 2008/0315938 A1* | 12/2008 | Ishikawa | H03K 17/567 | 327/333 |
| 2009/0027112 A1* | 1/2009 | Li | H03F 1/3211 | 327/540 |
| 2009/0128195 A1* | 5/2009 | Forbes | H03F 3/45183 | 327/89 |
| 2009/0231003 A1* | 9/2009 | Chen | H03K 4/50 | 327/157 |
| 2010/0054369 A1* | 3/2010 | Moon | H04L 25/0288 | 375/340 |
| 2010/0164630 A1* | 7/2010 | Witmer | H03F 1/0244 | 330/297 |
| 2010/0201438 A1* | 8/2010 | Granata | H03H 7/12 | 327/554 |
| 2011/0068846 A1* | 3/2011 | Shabra | H03M 1/0604 | 327/331 |
| 2011/0080218 A1* | 4/2011 | Zuffada | H03H 11/0422 | 330/278 |
| 2011/0278955 A1* | 11/2011 | Signorelli | H01L 31/02021 | 307/127 |
| 2012/0153910 A1* | 6/2012 | Bulzacchelli | G05F 1/575 | 323/272 |
| 2012/0286870 A1* | 11/2012 | Zuffada | H03H 11/0422 | 330/254 |
| 2013/0134963 A1* | 5/2013 | Introwicz | G01R 1/30 | 324/123 R |
| 2013/0272547 A1* | 10/2013 | Waller, Jr. | H03F 1/0233 | 381/120 |
| 2013/0307576 A1* | 11/2013 | Ilkov | G01R 31/2621 | 324/762.02 |
| 2014/0167509 A1* | 6/2014 | Fernald | H02J 1/00 | 307/31 |
| 2014/0184115 A1* | 7/2014 | Thomsen | H02P 27/06 | 318/400.06 |
| 2014/0354258 A1* | 12/2014 | Thomsen | H02M 3/07 | 323/299 |
| 2015/0014687 A1* | 1/2015 | Nakajima | G01R 19/0084 | 257/48 |

OTHER PUBLICATIONS

ST Semiconductor Application Note AN4071, *Introduction to comparators, their parameters and basic applications*, 2012, 27 pgs.

ON Semiconductor, LM339, LM339E, LM239, LM2901, LM2901E, LM2901V, NCV2901, MC3302 *Single Supply Quad Comparators*, 2016, 11 pgs.

Analog Devices Tutorial MT-083, *Comparators*, 2011, 7 pgs.

ON Semiconductor, NE521 *High-Speed Dual-Differential Comparator/Sense Amp*, 2006, 7 pgs.

Rohm Semiconductor Op-Amp/Comparator Application Note, *Operational Amplifier, Comparator (Tutorial)*, 2011, 52 pgs.

Texas Instruments, LM111, LM211, LM311, LM311Y *Differential Comparators With Strobes*, 1992, 16 pgs.

Texas Instruments, TL331 *Single Differential Comparator*, 1999-2015, 18 pgs.

Texas Instruments, TL331-Q1 *Single Differential Comparator*, 2009-2013, 11 pgs.

Texas Instruments, TL712 *Differential Comparator*, 2000, 6 pgs.

\* cited by examiner

APPARATUS FOR DIFFERENCING COMPARATOR AND ASSOCIATED METHODS

CROSS-REFERENCE TO RELATED APPLICATIONS

This application is a continuation-in-part of U.S. application Ser. No. 13/740,028, filed on Jan. 11, 2013, titled "Apparatus for Integrated Circuit Interface and Associated Methods," which claims priority to U.S. Provisional Patent Application No. 61/747,533, titled "Apparatus for Integrated Circuit Interface and Associated Methods," filed on Dec. 31, 2012. The foregoing applications are hereby incorporated by reference in their entireties for all purposes.

TECHNICAL FIELD

This disclosure relates generally to comparators and, more specifically, to comparators for comparing a differential signal to a programmable or fixed threshold value or level, and associated methods.

BACKGROUND

Conventional differential comparators may be used in applications such as microcontrollers. Such comparators generally consist of a differential comparator that can be used to: 1) compare a differential signal against a ground potential, 0V; or 2) compare a single-ended signal against a programmable threshold.

FIG. 1 shows a conventional comparator. The comparator in FIG. 1 is known to and understood by persons of ordinary skill in the art, and details of its structure and operation are known. Briefly, in the differential mode, typically two pins of a device, such as a microcontroller, are routed to the two comparator inputs. Except for possible hysteresis and offset, the comparator effectively compares this incoming differential signal to 0V.

In their single-ended mode, conventional comparators route a single pin to one comparator input, and the output of a programmable voltage generator, e.g., a voltage digital to analog converter (DAC), or VDAC, to the second comparator input. This scheme allows the comparator to compare the voltage on the pin to a programmable threshold. Details of the comparator shown in FIG. 1 are known to persons of ordinary skill in the art, and are therefore not described in any further detail.

SUMMARY

A variety of apparatus that include or comprise differencing comparators and related methods are contemplated. An apparatus according to one exemplary embodiment includes an integrated circuit (IC). The IC includes a differencing comparator. The differencing comparator receives a differential input signal. The differencing comparator compares the differential input signal to a threshold value. The differencing comparator includes a transconductance circuit coupled to receive the differential input signal and to provide a differential output signal.

A microcontroller unit (MCU) according to another exemplary embodiment includes an interface circuit coupled to receive and process at least one differential input signal to the MCU. The interface circuit includes at least one differencing comparator coupled to receive at least one differential input signal to the MCU and to compare the at least one differential input signal to the MCU to a programmable (or fixed) threshold value. The MCU further includes a charge pump. The charge pump generates a negative supply voltage and to provide the negative supply voltage to the at least one differencing comparator.

A motor control apparatus according to another exemplary embodiment includes a motor, and a driver coupled to receive at least one control signal and to control operation of the motor based on the at least one control signal. The motor control apparatus further includes an IC. The IC includes at least one differencing comparator coupled to receive at least one differential input signal corresponding to at least one current in the motor, and to compare the at least one differential input signal to a threshold value to generate at least one output signal. The IC further includes a processor coupled to receive the at least one output signal of the differencing comparator, and to generate the at least one control signal.

BRIEF DESCRIPTION OF THE DRAWINGS

The appended drawings illustrate only exemplary embodiments and therefore should not be considered as limiting the scope of the application or the claims. Persons of ordinary skill in the art appreciate that the disclosed concepts lend themselves to other equally effective embodiments. In the drawings, the same numeral designators used in more than one drawing denote the same, similar, or equivalent functionality, components, or blocks.

DETAILED DESCRIPTION

As noted above, the disclosure relates to comparators that compare differential signals against programmable or fixed thresholds (also called differencing comparators). Differencing comparators according to various embodiments provide several advantages and features, including: 1) they compare a differential signal against a programmable or fixed threshold, and 2) they support an input common-mode below the ground potential, e.g., significantly below the ground supply in a microcontroller.

Generally speaking, differencing comparators according to exemplary embodiments may be used in virtually any application where the above features are specified or desired. As merely one example, differencing comparators according to exemplary embodiments may be included or used in microcontrollers or motor-control ICs.

Figure 2:
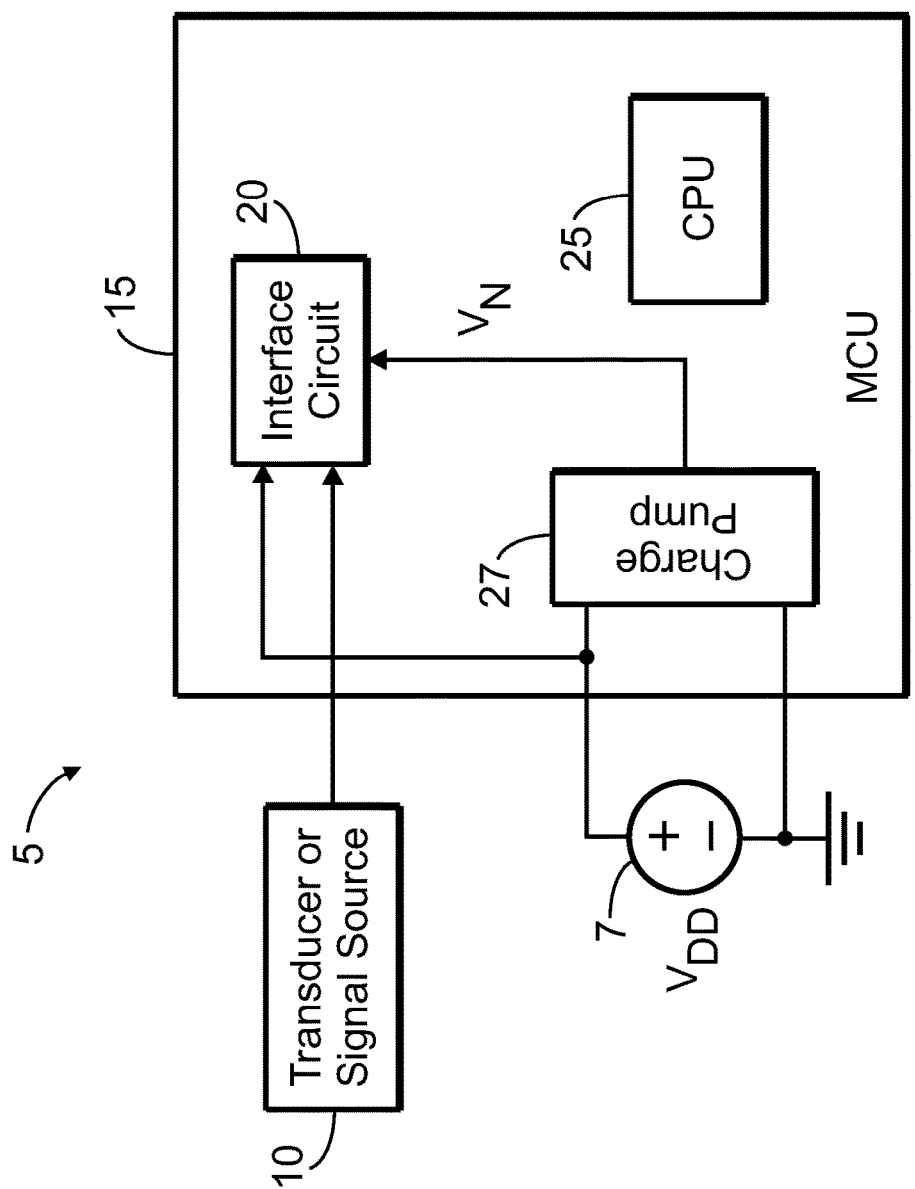
FIG. 2 depicts a circuit arrangement according to an exemplary embodiment that includes one or more differencing comparators.

FIG. 2 depicts a circuit arrangement according to an exemplary embodiment that includes one or more differencing comparators. Circuit arrangement 5 shows a transducer or signal source 10 coupled to an input of an MCU 15.

Transducer or signal source 10 generally provides a differential signal (which may be bidirectional or bipolar) to the input of MCU 15. In other words, the output signal of transducer or signal source 10 may have both positive and negative voltage (or current) swings or polarities or may be provided as the difference between two single-ended signals. In some applications, one of these single-ended signals may be coupled to a local ground reference of transducer or signal source 10. Depending on the output signal's amplitude and common-mode value (e.g., the average of the two single-ended signals relative to the ground reference of MCU 15), one or both of the single-ended signals providing the output signal to MCU 15 could swing significantly below the ground reference. Transducer or signal source 10 may constitute a variety of devices or circuits, such as sensors and the like, as persons of ordinary skill in the art understand.

MCU 15 includes interface circuit 20, which includes one or more differencing comparators (not shown explicitly). Interface circuit 20 can receive differential signals from transducer or signal source 10. In some applications, interface circuit 20 may tolerate, accommodate, or operate with both positive and negative input voltages or with one or both single-ended sides of the differential signal going below the ground reference of MCU 15 (e.g. 0V). Because of that feature, MCU 15 can interface with transducer or signal source 10 without using an additional power supply voltage, such as a negative power supply voltage.

In exemplary embodiments, MCU 15 is powered by one or more positive supply voltages, such as supply voltage $V_{DD}$ shown in FIG. 2, provided by supply voltage source 7. In the embodiment shown, however, MCU 15 does not use an externally provided negative supply voltage. Thus, interface circuit arrangements according to exemplary embodiments may have the advantage of relatively simple power supply configurations.

Some applications, such as motor control applications, have specifications that call for the comparator to accept inputs one volt below ground or more (e.g., <−1 volt). In such instances, MCU 15 may include charge pump 27. Charge pump 27 is coupled to supply voltage source 7 (i.e., receives $V_{DD}$ as an input voltage). Charge pump 27 converts the voltage $V_{DD}$ to a negative bias voltage $V_N$. Negative bias voltage $V_N$ is supplied to interface circuit 20. Interface circuit 20 uses negative bias voltage $V_N$ as a bias voltage for circuits (described below in detail) that can tolerate, accommodate, or operate with bidirectional or below-ground input voltages. Consequently, interface circuit 20 provides a flexible mechanism for interfacing with transducer or signal source 10.

Interface circuits according to various embodiments provide the advantage of using the negative bias signal, $V_N$, which provides a relatively small current, which is desirable in low power or portable applications. Integrated charge pump 27 can generate the negative bias signal $V_N$, (but not enough current for a conventional low-noise amplifier). The circuitry in interface circuit 20 do not draw significant power from charge pump 27, and is therefore suitable for use with the negative bias voltage, $V_N$, in low-power applications.

In exemplary embodiments, MCU 15 includes central processing unit (CPU) 25. CPU 25 performs general control of MCU 15, and may also provide a variety of data or information processing capabilities, as persons of ordinary skill in the art understand. Without limitation, CPU 25 may perform general programmable logic, arithmetic, control, and/or other tasks.

CPU 25 may also perform various tasks related to specific applications or end-uses. For example, in some embodiments, CPU 25 may perform motor control tasks, as described below in detail. Generally, the user of MCU 15 may program the desired functionality, as persons of ordinary skill in the art understand.

In some embodiments, MCU 15 may include one or more circuits for storing firmware. The firmware allows more flexible programming or configuration of MCU 15 for desired tasks, such as motor control. In exemplary embodiments, the firmware may be stored in non-volatile memory (NVM), such as electrically programmable read only memory (EPROM), flash memory, and the like. The firmware may be programmed in a variety of ways, as persons of ordinary skill in the art understand, for example, by using links (not shown) that interface with circuitry external to MCU 15.

In exemplary embodiments, interface circuit 20 operates in conjunction with CPU 25 (and firmware, as desired) and/or other circuitry (not shown) to perform various signal, data, or information processing tasks. Examples include amplification, comparator functions (e.g., differencing comparator functions), digital input/output (I/O), analog I/O, mixed signal I/O, analog to digital conversion (ADC), digital to analog conversion (DAC), etc. The choice of such tasks depends on the design and performance specifications for a given implementation or end-use, as persons of ordinary skill in the art understand.

Note that FIG. 2 illustrates a simplified block diagram of MCU 15. MCU 15 may include a variety of other circuits to provide desired features or functionality. Without loss of generality and limitation, MCU 15 may include one or more of other circuitry, such as a power-on reset (POR) circuit, power management unit (PMU), host interface circuitry, brownout detector, watchdog timer, and the like. In some embodiments, one or more of the above circuits may be included in MCU 15, as desired.

Furthermore, rather than using an MCU, one may use other types of circuits and/or firmware or software to implement desired functionality, such as motor control systems, according to various embodiments. For example, one may use microprocessors, finite state machines, programmable logic (e.g., field programmable gate arrays), and the like, by making appropriate modifications to the circuitry shown in FIG. 2. The choice of circuitry and associated firmware/ software depends on factors such as design and performance specifications for a given implementation, available technology, cost, etc., as persons of ordinary skill in the art understand.

In addition, note that, rather than an MCU as shown in the exemplary embodiment of FIG. 2, generally any type of IC may include interface circuit 20, including one or more differencing comparators, as desired. The choice of type and configuration of such ICs depend on factors such as design and performance specifications, available technology, end-use, user preferences, cost, and the like, as persons of ordinary skill in the art understand. Generally speaking, differencing comparators according to various embodiments may be included in an IC or other electronic circuit arrangement, as desired.

As noted, interface circuits, specifically differencing comparators, according to various embodiments may be used in a variety of situations. Without limitation and loss of generality, one application includes motor control. In this application, MCU 15 (or other IC or electronic circuit, as desired) receives signals (for example, current signals or signals related to current and/or voltage levels) related to the operation of the external motor, and provides signals to an external driver circuit to control the motor.

Figure 3:
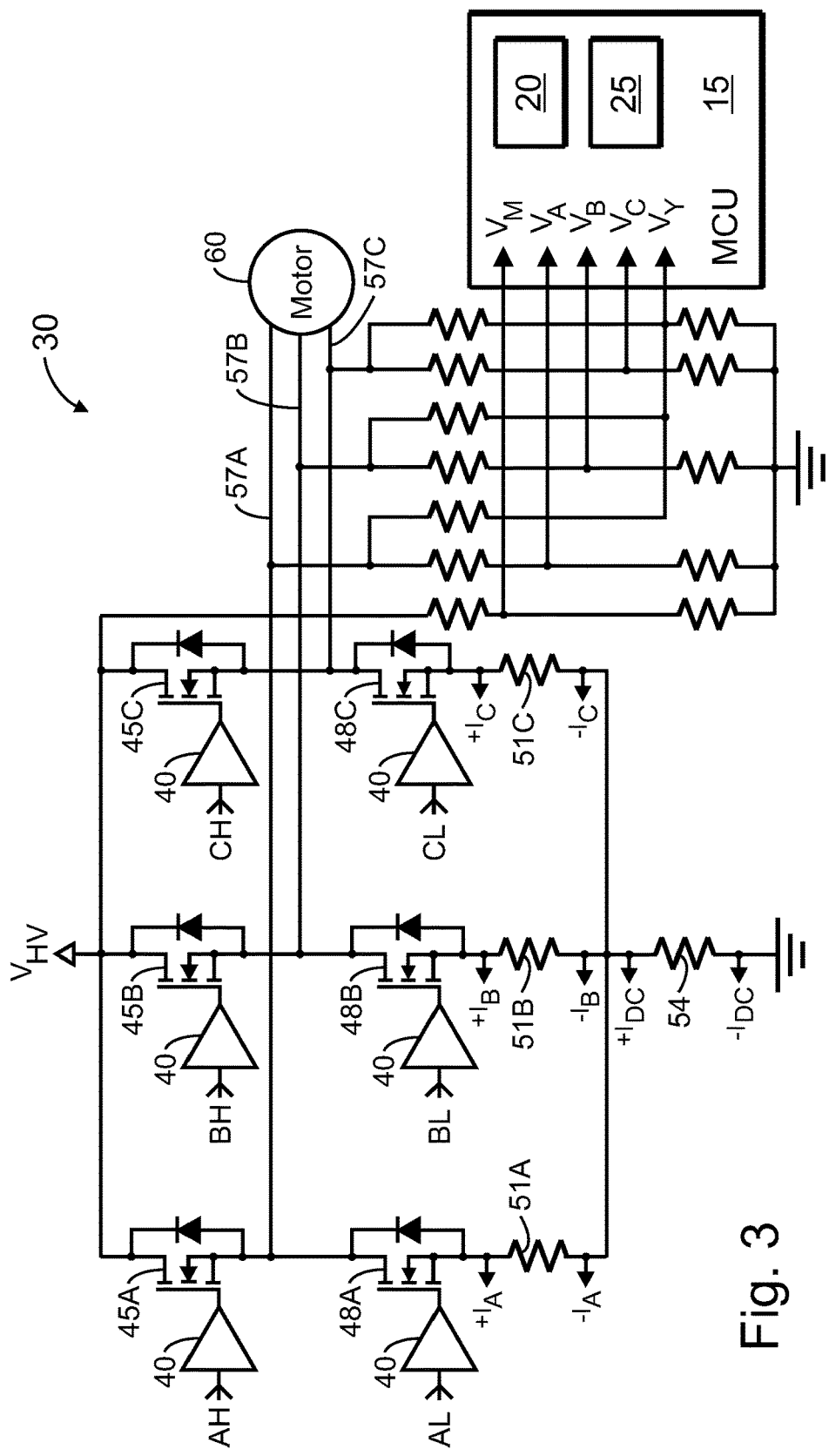
FIG. 3 shows a block diagram of a circuit arrangement for driving an electrical motor according to an exemplary embodiment.

FIG. 3 shows a block diagram of a circuit arrangement 30 for driving an electrical motor according to an exemplary embodiment. Generally, FIG. 3 shows a three phase driver circuit coupled to a motor 60. In addition, FIG. 3 shows a set of resistor dividers to scale various voltages related to the driver circuit and/or motor 60, as described below in detail. Furthermore, FIG. 3 shows current sensing or sense resistors 51A-51C and 54, as described below in detail.

In the embodiment shown, the driver circuit is a three phase inverter and drives a three phase motor 60. As persons of ordinary skill in the art understand, however, other arrangements (e.g., single-phase driver or inverter driving a single-phase motor) are possible, and contemplated, and may be implemented by making appropriate modifications.

For example, in some embodiments, the driver circuit may be a single phase driver circuit and may drive a single phase motor. In such a situation, two of the three driver circuit legs or branches shown in FIG. 3 are used to drive the single phase motor. Generally, the topology of the driver circuit and type of motor depend on the design and performance specifications for a given motor control system implementation, as persons of ordinary skill in the art understand.

Referring to the exemplary embodiment shown in FIG. 3, the driver circuit includes three legs or circuit branches. Each leg includes an upper transistor, and a lower transistor. FIG. 3 includes upper transistors 45A-45C and lower transistors 48A-48C, which correspond to the three phases, respectively.

Transistors 45A-45C and 48A-48C act as switches to provide power from a link or supply, with a voltage $V_{HV}$, to motor 60, in a manner known to persons of ordinary skill in the art. Note that, although FIG. 3 shows power metal oxide semiconductor field effect transistors (MOSFETs), other types of switch or device may be used, as persons of ordinary skill in the art understand.

Without limitation, bipolar junction transistors (BJTs), insulated gate bipolar transistors (IGBTs), etc., may be used, as desired. The choice of switch or device selection depends on a variety of factors, such as power and/or voltage level, size of motor 60, switching frequency of the devices, cost, available technology, etc., as persons of ordinary skill in the art understand.

A set of buffers or drivers 40 drive upper transistors 45A-45C and lower transistors 48A-48C. Drivers 40 may provide appropriate drive signals to cause the switching of upper transistors 45A-45C (n-channel MOSFETs in the embodiment shown) and lower transistors 48A-48C (n-channel MOSFETs in the embodiment shown) in response to control signals from MCU 15. Note that, in some embodiments, upper transistors 45A-45C may be p-channel MOSFETs, depending on factors such as voltage and power levels, as persons of ordinary skill in the art understand.

More specifically, a set of control signals AH-CH serve as input signals to drivers 40 for upper transistors 45A-45C, respectively. Another set of control signals, AL-CL, serve as input signals to drivers 40 for lower transistors 48A-48C, respectively. By controlling signals AH-CH and AL-CL, MCU 15 may control upper transistors 45A-45C and lower transistors 48A-48C, thus controlling the supply of power to the corresponding phases of motor 60.

More specifically, node 57A of upper transistor 45A and lower transistor 48A drives the first phase of motor 60. Node 57B of upper transistor 45B and lower transistor 48B drives the second phase of motor 60. Finally, node 57C of upper transistor 45C and lower transistor 48C drives the third phase of motor 60.

A set of current sense resistors, 51A-51C, sense the current flowing in each leg or branch of the driver circuit, by generating a set of voltages that are supplied to MCU 15. As the current in a motor winding increases, a voltage develops across the resistor in that winding's current path, a current sense resistor. Depending on the specific application, this voltage may be positive, negative, or both (e.g., alternating).

Motor controllers generally monitor the voltages across the current sense resistors to detect when the voltage, and hence the current, exceeds some safe limit (or to control the motor according to some scheme, such as pulse-width modulation (PWM), or both). Although one side of these current-sense resistors are often connected to a ground reference, the voltage across the resistor is generally monitored differentially to remove artifacts due to resistance and inductance in the ground reference path.

Figure 1:
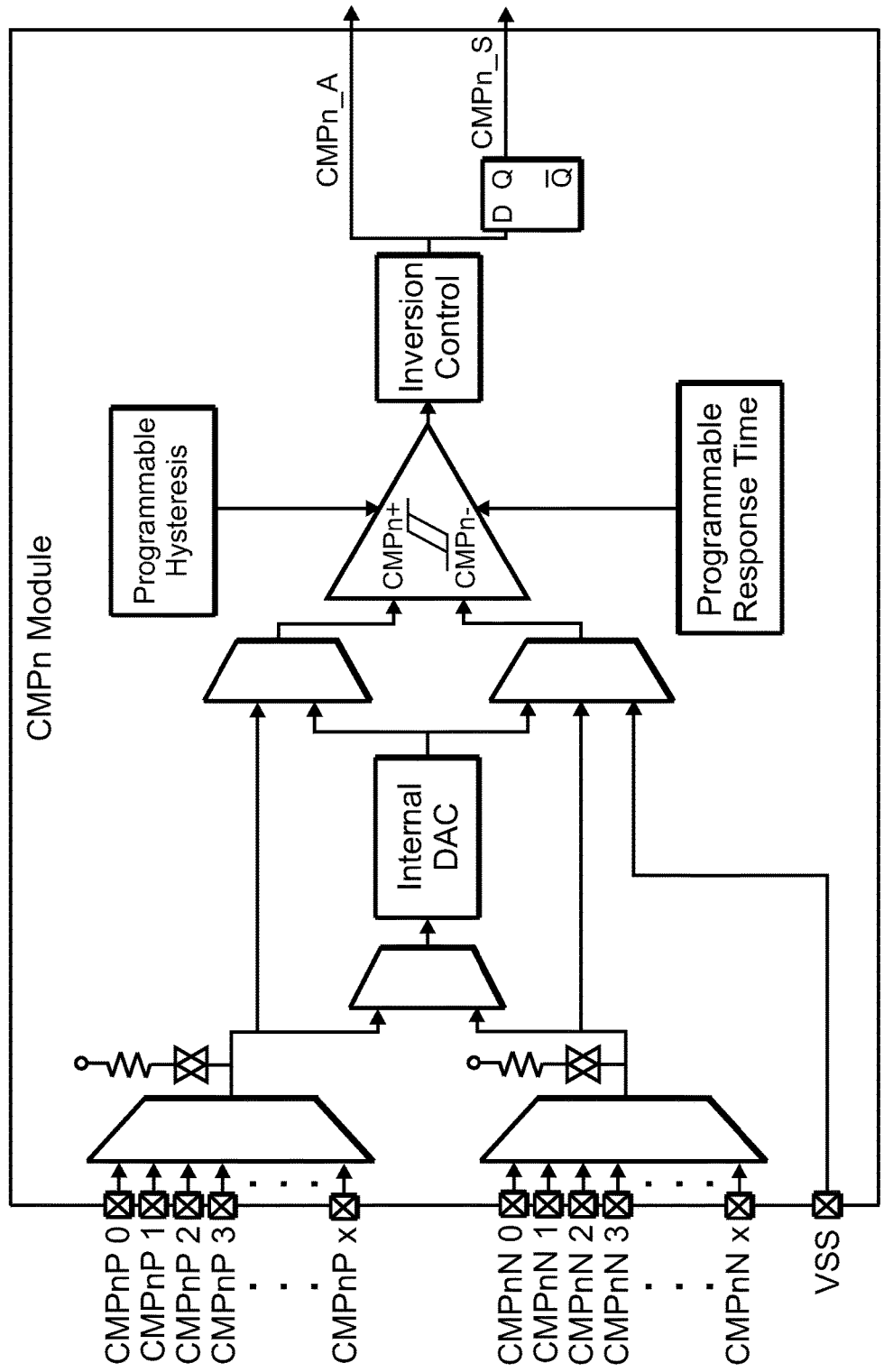
FIG. 1 illustrates a conventional comparator.

In conventional approaches, processing the differential signal generally entails a level-shifting differential-to-single-ended amplifier (to shift the differential current-sense voltage above the ground reference and convert to a single-ended voltage) and a voltage comparator which compares this single-ended voltage against a programmable threshold (such as shown in FIG. 1). This threshold defines the current limit allowed for the particular application.

As described below in detail, embodiments according to the disclosure, however, avoid the cost of the level-shifting amplifier and input bias currents generally found in level-shifting amplifiers. Such embodiments provide a differencing comparator which can directly accept the differential current-sense voltage (even though one or both of its signals may be below the ground reference) and compare it against a programmable or fixed threshold.

Referring back to FIG. 3, resistor 51A senses the current flowing in the first branch of the driver circuit, giving rise to voltages $+I_A$ and $-I_A$. The difference between voltages $+I_A$ and $-I_A$ is proportional to the current through the first branch of the driver circuit. Thus, resistor 51A provides a differential signal to MCU 15 that is proportional to and indicates the level of current in the first branch of the driver circuit.

Similarly, resistor 51B senses the current flowing in the second branch of the driver circuit, giving rise to voltages $+I_B$ and $-I_B$, which is provided to MCU 15 as a differential signal. Finally, resistor 51C senses the current flowing in the third branch of the driver circuit, giving rise to voltages $+I_C$ and $-I_C$, which is provided to MCU 15 as a differential signal.

Note that in some embodiments, the current may be sensed by using two sense resistors, for example, 51A-51B. In this situation, voltages $+I_A$ and $-I_A$ and $+I_B$ and $-I_B$ are provided to MCU 15 as differential signals. In other embodiments, current may be sensed by one resistor.

Specifically, resistor 54 may be used to sense the current flowing through the branches of the driver circuit (more specifically, through lower transistors 48A-48C), to develop voltages $+I_{DC}$ and $-I_{DC}$. Voltages $+I_{DC}$ and $-I_{DC}$ may be provided to MCU 15 as a differential signal.

As noted, in some embodiments, some of the current sense resistors might not be used. In such situations, the unused resistors may be replaced with short circuits (e.g., a length of wire, PCB trace, etc.) to decrease or eliminate the power that would otherwise be dissipated in the unused sense resistor(s).

As noted, a set of resistor dividers are used to scale various voltages in the circuit shown in FIG. 3. The resistor dividers scale the motor or link voltages down to levels that are safe, compatible, or comparable to the supply and/or input voltages of MCU 15.

Thus, resistor dividers scale the three phase voltages and provide the resulting scaled phase voltages as $V_A$, $V_B$, and $V_C$, respectively. Similarly, a resistor divider is used to scale the supply or link voltage, $V_{HV}$, down to a voltage $V_M$. An additional resistor divider provides a scaled virtual Y sum of the three phase voltages as $V_Y$.

Note that, depending on the type of motor, or motor control technique, some of the resistor dividers may not be used. For example, the resistor divider that generates $V_M$ is used for field oriented control. Thus, for field oriented control, the other voltage dividers may not be used.

The various voltages from the resistor dividers (e.g., $V_A$-$V_C$, $V_M$, $V_Y$) are provided to MCU 15. MCU 15 uses those voltages to perform motor control in various modes of operation.

Note that in some embodiments, the various voltages present in the circuit in FIG. 3 (e.g., $V_A$-$V_C$, $V_Y$) may be comparable to, or safe to apply to, MCU 15. In such situations, the applicable resistor dividers may be omitted, as desired, and the corresponding voltages may be coupled to MCU 15.

Note that FIG. 3 shows an exemplary circuit arrangement for controlling a motor. A number of variations are contemplated as within the scope of the disclosure. For example, different types of motors may be controlled or driven. As one example, a brushless DC (BLDC) motor may be controlled.

Furthermore, rather than using an MCU, one may use other types of circuits and/or firmware or software to implement desired functionality, such as motor control systems, according to various embodiments. For example, one may use microprocessors, finite state machines, programmable logic (e.g., field programmable gate arrays), and the like, by making appropriate modifications to the circuitry shown in FIG. 3. The choice of circuitry and associated firmware/software depends on factors such as design and performance specifications for a given implementation, available technology, cost, etc., as persons of ordinary skill in the art understand.

Note that a variety of applications other than motor control for differencing comparators are possible and contemplated. For example, in some embodiments, a power control apparatus may be implemented that uses one or more differencing comparators. In one exemplary embodiment, the power control apparatus includes a power filter (such as an inductor feeding a capacitor), and a driver circuit that receives at least one control signal, and in response controls the output state of the power filter based on the control signal(s). The power control apparatus may further include an IC. The IC includes at least one differencing comparator that receives at least one differential input signal corresponding to at least one current in the driver circuit. The IC, using one or more differencing comparators, compares the differential input signal(s) to one or more programmable or fixed threshold values to generate at least one output signal. The IC may also include a processor or control circuit that receives the output signal(s) of the differencing comparator (s), and generates the control signal(s).

Figure 4:
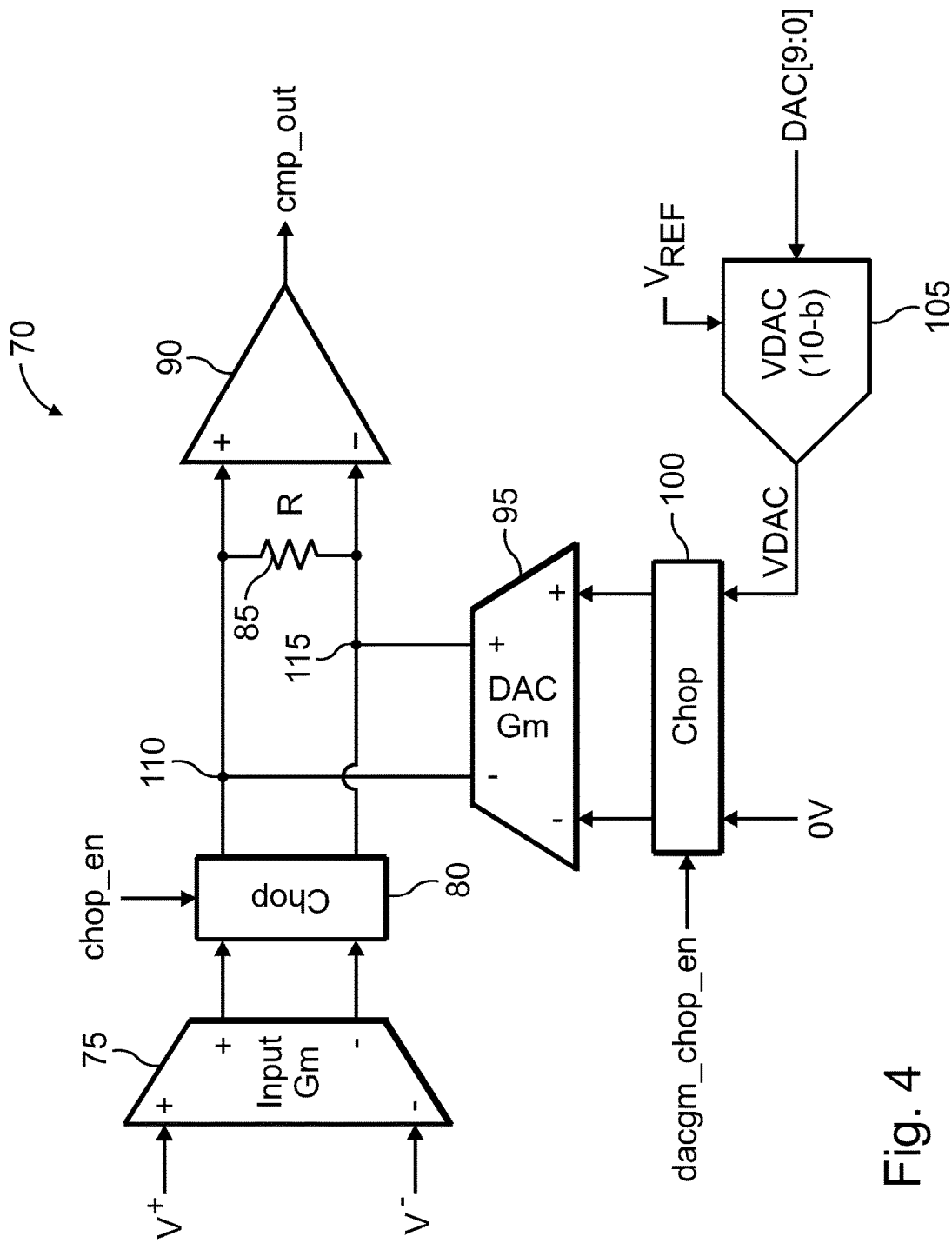
FIG. 4 depicts a block diagram of a differencing comparator according to an exemplary embodiment.

FIG. 4 depicts a block diagram of a differencing comparator according to an exemplary embodiment. Conceptually, differencing comparator 70 operates by converting the differential input voltage (labeled as "V+" and "V−") and the programmable threshold signal or voltage (labeled as "DAC [9:0]") into differential currents, subtracting those currents (by simple connection of the signals at nodes 110 and 115).

By forcing the current through resistor 85, the resulting current difference is then converted into a second differential voltage across the input of comparator 90, and the second differential voltage is compared to 0V to produce a resulting output logic level (labeled as "cmp_out").

Input Gm block (or circuit) 75 and digital-to-analog converter Gm (or DAC Gm) block (or circuit) 95 in FIG. 4 convert the differential input voltage (V+ and V−) and the threshold voltage from voltage DAC (VDAC) 105 (which, using reference signal $V_{REF}$, converts the digital representation of the threshold voltage into an analog voltage VDAC), respectively, into differential currents. Note that in some embodiments, VDAC 105 may be omitted, as desired. Thus, rather than using VDAC 105, the desired threshold signal may be provided to chop stage 100 as an analog signal.

Referring again to FIG. 4, a given Gm stage (also called a transconductance stage) has the following transfer function:

$$I=F(v^+-v^-),$$

where $v^+$ an $v^-$ represent the two sides of its differential input voltage and function F( ) is the Gm block's transconductance function.

In general, the function F is fairly linear for small input voltages (e.g., less than 100 mV in some embodiments). As explained below, one advantage of the disclosed concepts is that the non-linearity of the transconductance function is cancelled by the comparator's architecture.

The operation of the comparator can be written as:

$$(F_{IN}(v^+-v^-)-F_{VDAC}(\text{VDAC}-0V))\cdot R< >0V, \quad\quad (\text{Eq. 1})$$

where R is the resistance value of resistor 85. Equation 1 can be simplified as:

$$F_{IN}(v^+-v^-)< >F_{VDAC}(\text{VDAC}-0V).$$

Thus, the comparator changes its output logic value about the point at which the two F functions in the above equation are equal or nearly or substantially equal.

If the transfer functions of Input Gm block 75 and DAC Gm block 95, $F_{IN}( )$ and $F_{VDAC}( )$, respectively, are identical (or nearly or substantially identical, for example, allowing for variations in practical implementations), the two stages will generate the same output currents given the same input voltages. Hence, the point at which the transfer function outputs equal each other is the same point at which their two input voltages equal each other. This property can be written as:

$$v^+-v^-< >\text{VDAC}$$

Thus, by using identical Gm stages to convert both the differential input voltage and the threshold voltage, the comparator performs the desired comparison regardless of the exact shape of the Gm stages' transfer functions. This property allows the comparator to perform its differencing function relatively accurately in the presence of Gm non-linearities, etc.

Differencing comparator 70, as shown in the embodiment of FIG. 4, includes two "chop" stages (or sign inversion stage or circuit), labeled as 80 and 100. A chop stage simply swaps the two sides of a differential signal, effectively inverting the sign of the differential signal. Chop stage 100, driving DAC Gm stage 95, controls the polarity of the comparison threshold. For simplicity, in some embodiments, VDAC 105 may generate positive voltages (rather than negative or bipolar), as persons of ordinary skill in the art understand.

For positive comparison thresholds, the positive voltage generated by VDAC 105 is passed through chop stage 100 to the positive input of DAC Gm stage 95, whereas the 0V reference is passed to the negative input of DAC Gm stage 95. This scheme results in the behavior represented by Eq. 1, above.

To generate negative thresholds, chop stage 100 is used to connect the output of VDAC 105 to the negative input of DAC Gm stage 95 and the 0V reference to the positive input of DAC Gm stage 95. This scheme results in a behavior represented by the following equation:

$$(F_{IN}(v^+ - v^-) - F_{VDAC}(0V - VDAC)) \cdot R < > 0V$$

The dacgm_chop_en input signal controls the operation of chop stage 100, or the sign of the comparison threshold, as described above.

Chop stage 80, which follows Input Gm stage 75, provides a mechanism for cancellation of the input offset of the comparator using the following procedure:
1. Couple both inputs of differencing comparator 70 to the same voltage, typically 0V.
2. With chop_en=0 (logic zero level), adjust the threshold to the trip point of differencing comparator 70. Store the resulting threshold as $V_1$.
3. With chop_en=1 (logic one level), adjust the threshold to the trip point of differencing comparator 70. Store the resulting threshold as $V_2$.
4. De-assert chop_en.

Following the procedure above, the value $[(V_1-V_2)/2]$ can be subtracted from the desired comparison threshold to correct for the input offset of the comparator. This procedure can be implemented in firmware, hardware, or a combination of the two, as desired.

A second aspect of differencing comparators according to various embodiments is to accept input voltages whose common-mode voltage is significantly below the ground reference. Conventional comparators, such as shown in FIG. 1, can often accept inputs only slightly below ground. For example, by using the well-known folded-cascode architecture with p-type metal oxide semiconductor (PMOS) input transistors, conventional comparators can accept inputs down to perhaps about 250 mV below ground.

Some applications, however, such as the motor control application discussed above, have specifications that call for the comparator to accept inputs one volt below ground or more (e.g., <−1 volt). Comparators according to various embodiments support such specifications by using a folded-cascode architecture in the Input Gm stage whose lower supply is generated by a −1V (or other desired level) charge pump 27 (see FIG. 2).

Figure 5:
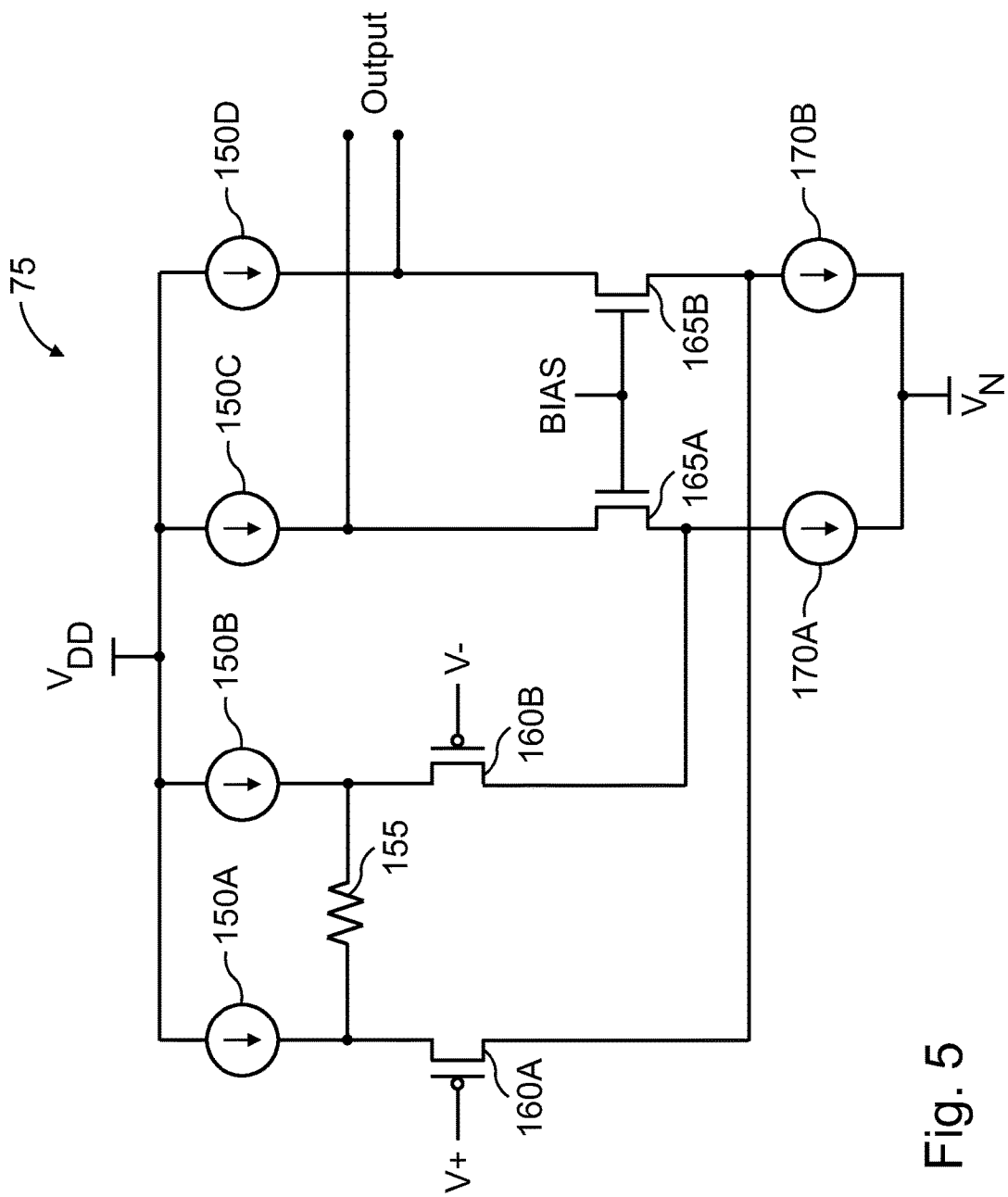
FIG. 5 illustrates a schematic diagram of a transconductance circuit in a differencing comparator according to an exemplary embodiment.

FIG. 5 illustrates a simplified schematic diagram of Input Gm stage 75. When a voltage is applied to PMOS input transistors 160A-160B, that same approximate voltage is generated across resistor 155. The resulting current through the resistor causes a difference in the currents leaving the drain nodes (i.e., the lower nodes shown in FIG. 5) of PMOS input transistors 160A-160B. The difference in current propagates to the output (Out) of Input Gm stage 75 as a differential current via transistors 165A-165B.

Current sources 150A-150B establish the steady-state current through transistors 160A-160B when the differential input voltage is zero or nearly zero in a practical implementation. Similarly, current sources 150C-150D establish the steady-state current through transistors 165A-165B when the differential input voltage is zero or nearly zero. In general, current sources 170A and 170B are chosen to equal the sum of current sources 150B plus 150C, and the sum of 150A and 150D, respectively, thereby causing the differential output current to equal zero or nearly zero when the differential input voltage is zero. Current sources 170A-170B also couple transistors 160A-160B and 165A-165B to a lower supply voltage of the output stage, $V_N$, in the embodiment shown. A bias signal labeled "BIAS" provides an appropriate bias voltage to the gates of transistors 165A-165B.

The lower supply of the output stage, $V_N$, is driven by charge pump 27, as described above. Since a properly biased folded-cascode Gm stage can accept input voltages slightly below its lower supply potential, using charge pump 27 to provide a negative voltage (e.g., −1V) allows the differencing comparator to accept inputs more than one volt below the ground reference (for example, the microcontroller's ground reference).

As noted above, in exemplary embodiments, Input Gm stage 75 and DAC Gm stage 95 are matched to provide relatively accurate comparisons independent of the linearity of the Gm stages. As indicated in FIG. 5, the lower supply of Input Gm stage 75 is powered by $V_N$ (e.g., −1V). Conversely, the lower supply of the DAC Gm stage 95 is coupled to the ground reference (0V). This arrangement allows limiting the current sink specifications for charge pump 27, which in turn limits its size and therefore its cost. This difference in the power arrangements of Input Gm stage 75 and DAC Gm stage 95 has relatively little effect on the accuracy of the differencing comparator as long as their respective inputs remain in the allowed input range of each stage. Furthermore, since the output of Input Gm stage 75 is a differential current, Input Gm stage 75 is supplied by $V_N$. Other blocks in the differencing comparator can be coupled to the ground reference, thereby reducing the current delivery requirements of charge pump 27.

Another aspect of differencing comparators according to various embodiments relates to supporting a relatively wide range of differential input voltages. The maximum amplitude of the differential input signal supported by the comparator is constrained, in part, by the value of resistor 155 (see FIG. 5) and the value of current sources 150A-150B, which feed the input stage (transistors 160A-160B). In approximate terms, the comparator fails to operate when the input voltage exceeds I·R, where I is the current through current sources 150A and 150B, and R is the resistance of resistor 155.

The supported input range can be increased by increasing I and/or R. Doing so, however, tends to also increase the thermal noise generated by the comparator, and hence inhibits the comparison of relatively small input voltages. Although it is possible to make the resistor in a single input stage adjustable by using switches and various resistor values, the resistance of the switches serves to: 1) generate additional thermal noise, and 2) distort the precision and matching between Input Gm stage 75 and DAC Gm stage 95.

Figure 6:
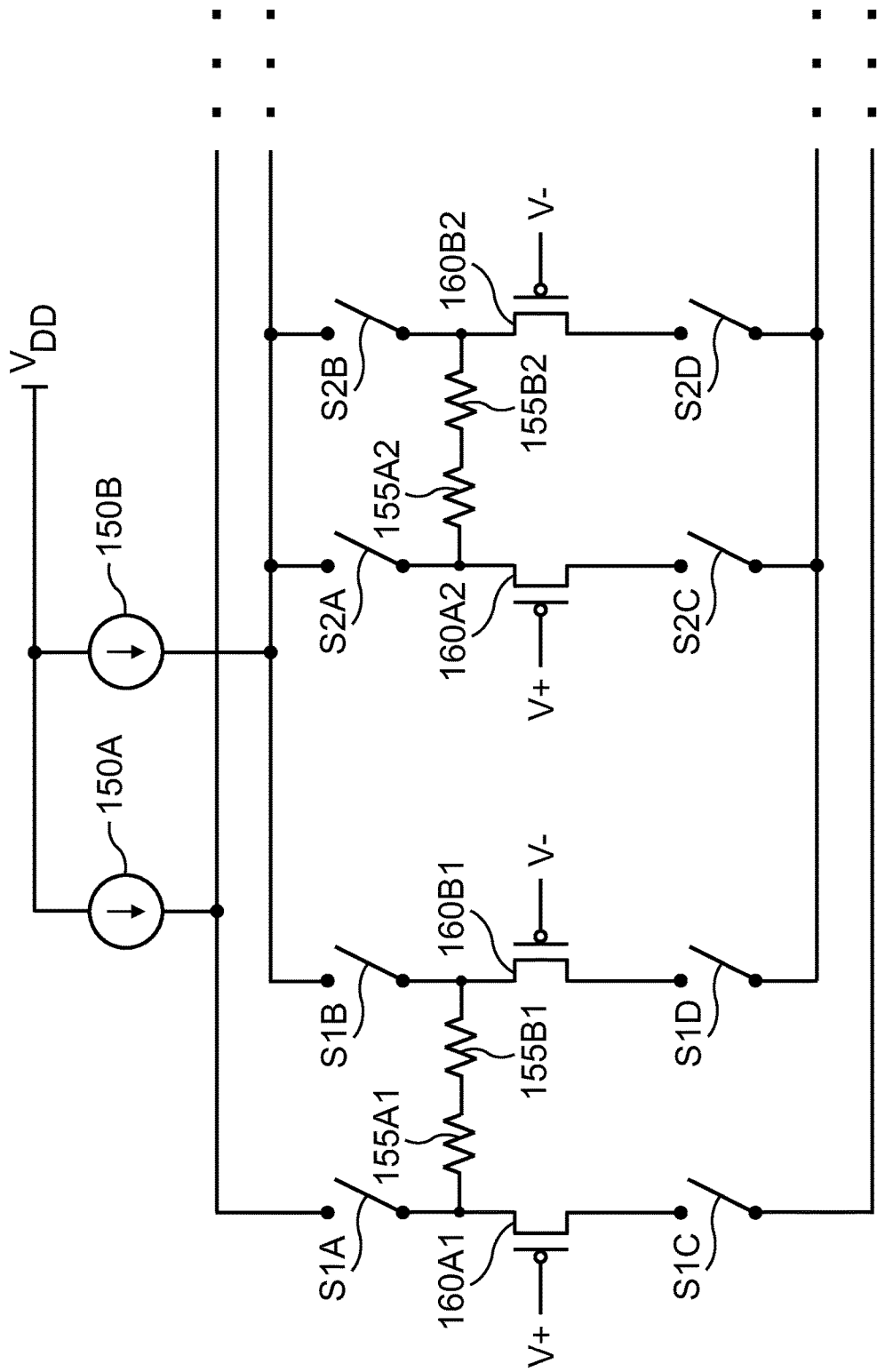
FIG. 6 depicts a schematic diagram of the input stage of a differencing comparator according to an exemplary embodiment.

Differencing comparators according to exemplary embodiments overcome this contention by providing a set of input stages, each having different resistor values, as shown in FIG. 6. This arrangement allows the user to select an input stage, and hence an input voltage or signal range, that is appropriate for a given application. The comparator couples the selected input stage using two sets of switches.

More specifically, referring to the example in FIG. 6, the input stage shown includes transistors 160A1-160B1, resistors 155A1-155B1, and switches S1A-S1D to implement an input stage having a first desired range of input signal values. Similarly, the input stage shown includes transistors 160A2-160B2, resistors 155A2-155B2, and switches S2A-S2D to implement an input stage having a second desired range of input signal values.

By closing either switches S1A-S1D or switches S2A-S2D, the input stage shown in FIG. 6 can accept either the first or the second range of input signals. Note that switches S1A-S1D and switches S2A-S2D are not coupled between transistors 160A1-160B1 and transistors 160A2-160B2, respectively, and their corresponding resistors, i.e., resistors 155A1-155B1 and resistors 155A2-155B2, respectively. Consequently, the transconductance (Gm) of the input stages are not substantially affected by the switch parasitic resistances. In other embodiments, switches S1A, S1B, S2A, and S2B may be omitted. Instead, each pair of input transistors (e.g., transistors 160A1 and 160B1) may be coupled to their own pair of bias current sources (similar to current sources 150A and 150B).

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to those described here will be apparent to persons of ordinary skill in the art. Accordingly, this description teaches those skilled in the art the manner of carrying out the disclosed concepts, and is to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art may use certain features of the disclosed concepts independently of the use of other features, without departing from the scope of the disclosed concepts.

The invention claimed is:

1. An apparatus, comprising:
an integrated circuit (IC), comprising:
a differencing comparator to receive a differential input signal and to compare the differential input signal to a threshold value, wherein the differencing comparator comprises a first transconductance circuit coupled to receive the differential input signal and to provide a first differential output signal; and a first sign inversion circuit to selectively invert a sign of the first differential output signal.

2. The apparatus according to claim 1, wherein the differencing comparator comprises a second transconductance circuit coupled to receive a signal corresponding to the threshold value and to provide a second differential output signal.

3. The apparatus according to claim 2, wherein the differencing comparator comprises a second sign inversion circuit to selectively invert a sign of the second differential output signal.

4. The apparatus according to claim 2, wherein the differencing comparator comprises a comparator to generate an output signal of the differencing comparator based on a difference of the first and second differential signals.

5. The apparatus according to claim 4, wherein the first transconductance circuit is coupled to receive a supply voltage of the IC and a negative supply voltage.

6. The apparatus according to claim 5, wherein the IC further comprises a charge pump to generate the negative supply voltage coupled to the first transconductance circuit.

7. The apparatus according to claim 5, wherein the second transconductance circuit is coupled to receive a supply voltage of the IC and a ground potential.

8. The apparatus according to claim 1, further comprising a current sensor to sense a current and to generate the differential input signal.

9. The apparatus according to claim 1, wherein the first transconductance circuit comprises a plurality of input transistors coupled to a respective plurality of switches, and wherein different input signal ranges of the differencing comparator are selected by controlling the plurality of switches.

10. The apparatus of claim 1, wherein the threshold value is programmable.

11. A microcontroller unit (MCU), comprising:
an interface circuit coupled to receive and process at least one differential input signal to the MCU, the interface circuit comprising at least one differencing comparator coupled to receive the at least one differential input signal to the MCU and to compare the at least one differential input signal to the MCU to a programmable threshold value; and
a charge pump to generate a negative supply voltage and to provide the negative supply voltage to the at least one differencing comparator.

12. The MCU according to claim 11, further comprising a central processing unit (CPU) coupled to the interface circuit to receive a result of comparing the at least one differential input signal to the MCU to the programmable threshold value.

13. The MCU according to claim 12, wherein, in response to the result of comparing the at least one differential input signal to the MCU to the programmable threshold value, the CPU generates at least one control signal.

14. The MCU according to claim 13, wherein the at least one differential input signal to the MCU corresponds to a sensed current.

15. The MCU according to claim 11, wherein the differencing comparator comprises a first transconductance circuit coupled to receive the at least one differential input signal to the MCU and to provide a first differential output signal, and a second transconductance circuit coupled to receive a signal corresponding to the programmable threshold value and to provide a second differential output signal.

16. A motor control apparatus, comprising:
a motor;
a driver circuit coupled to receive at least one control signal and to control operation of the motor based on the at least one control signal;
an integrated circuit (IC), comprising:
at least one differencing comparator coupled to receive at least one differential input signal corresponding to at least one current in the motor, and to compare the at least one differential input signal to a threshold value to generate at least one output signal;
a processor coupled to receive the at least one output signal of the differencing comparator, and to generate the at least one control signal.

17. The motor control apparatus according to claim 16, comprising at least one resistor to sense the at least one current in the motor.

18. The motor control apparatus according to claim 16, further comprising a charge pump to generate a negative voltage and to provide the negative voltage as a supply voltage of the differencing comparator.

19. The motor control apparatus according to claim 16, wherein the differencing comparator comprises an input stage that accommodates a plurality of ranges of the at least one differential input signal.

20. The motor control apparatus according to claim 16, wherein the threshold value corresponds to a current limit, and wherein the processor generates the at least one control signal based on whether the at least one output signal of the differencing comparator indicates that the at least one current in the motor exceeds the current limit.

\* \* \* \* \*